US011892360B2

United States Patent
Dwivedi et al.

(10) Patent No.: US 11,892,360 B2
(45) Date of Patent: Feb. 6, 2024

(54) CONTROLLED CURVATURE CORRECTION IN HIGH ACCURACY THERMAL SENSOR

(71) Applicant: STMicroelectronics International N.V., Geneva (CH)

(72) Inventors: Atul Dwivedi, Benares (IN); Pijush Kanti Panja, Singur (IN)

(73) Assignee: STMicroelectron nternational N.V., Geneva (CH)

( * ) Notice: Subject to any disclaimer, the term of this patent is extended or adjusted under 35 U.S.C. 154(b) by 522 days.

(21) Appl. No.: 17/136,240

(22) Filed: Dec. 29, 2020

(65) Prior Publication Data

US 2021/0239540 A1 Aug. 5, 2021

Related U.S. Application Data

(60) Provisional application No. 62/968,539, filed on Jan. 31, 2020.

(51) Int. Cl.
*G01K 7/00* (2006.01)
*H03K 17/60* (2006.01)

(52) U.S. Cl.
CPC .............. *G01K 7/00* (2013.01); *H03K 17/60* (2013.01); *G01K 2219/00* (2013.01)

(58) Field of Classification Search
CPC .... G01K 7/01; G01K 2219/00; G01K 15/005; G01K 7/34; G01K 7/425; G01K 7/015;
(Continued)

(56) References Cited

U.S. PATENT DOCUMENTS 5,365,129 A * 11/1994 Slemmer .......... G01R 19/16576
327/91
5,982,221 A * 11/1999 Tuthill .................... H01L 23/34
327/512
(Continued)

FOREIGN PATENT DOCUMENTS

CN 100377483 C * 3/2008 ............... H03K 7/08
IT 201800004496 A1 10/2019
(Continued)

OTHER PUBLICATIONS

G. Ge, C. Zhang, G. Hoogzaad, and K. Makinwa, "A single-trim CMOS bandgap reference with a 3 inaccuracy of 0.15% from 40C to 125C," in Solid-State Circuits Conference Digest of Technical Papers (ISSCC), 2010 IEEE International, Feb. 2010, pp. 78-79.
(Continued)

*Primary Examiner* — Gail Kaplan Verbitsky
(74) *Attorney, Agent, or Firm* — Crowe & Dunlevy

(57) ABSTRACT

Circuitry generates base-to-emitter voltages (Vbe1, Vbe2) of two BJTs biased at different current densities, a base-to-emitter voltage (Vbe) of a BJT biased so Vbe is complementary to absolute temperature and has a curved non-linearity across temperature, and base-to-emitter voltages (Vbe1_c, Vbe2_c) of two BJTs biased by a temperature independent constant current and a current proportional to absolute temperature so Vbe2_c−Vbe1_c has the same but opposite curved non-linearity across temperature as Vbe. A sampling circuit samples these voltages and provides them to inputs of a loop filter. Filter outputs are quantized to produce a bitstream. The sampling circuit: when the received bit of the bitstream is zero, causes integration of Vbe1−Vbe2 to produce a voltage proportional to absolute temperature ($\alpha\Delta$Vbe); and when the received bit of the bitstream is one, causes integration of Vbe2_c−Vbe_Vbe1_c
(Continued)

to produce a negative voltage complementary to absolute temperature −Vbe_c without non-linearity across temperature.

22 Claims, 7 Drawing Sheets

(58) Field of Classification Search
CPC .. G01K 7/00; G01K 7/14; G01K 1/00; G01K 1/024; G01K 15/00; G01K 15/002; G01K 17/00; G01K 7/006; G01K 7/18; H03K 17/60
See application file for complete search history.

(56) References Cited

U.S. PATENT DOCUMENTS

| | | | | |
|---|---|---|---|---|
| 7,010,440 B1* | 3/2006 | Lillis | ............ | G01K 7/01 |
| | | | | 327/512 |
| 11,015,985 B2* | 5/2021 | Eberlein | ............ | G01K 7/01 |
| 11,223,368 B1* | 1/2022 | Prakash | ............ | H03M 1/0673 |
| 11,644,367 B2* | 5/2023 | Michel | ............ | H03M 1/066 |
| | | | | 374/178 |
| 2013/0113550 A1* | 5/2013 | Bawa | ............ | H03H 19/004 |
| | | | | 327/554 |
| 2021/0239540 A1 | 8/2021 | Dwivedi et al. | | |
| 2022/0364936 A1* | 11/2022 | Horng | ............ | G01K 15/002 |

FOREIGN PATENT DOCUMENTS

| | | | |
|---|---|---|---|
| JP | 2006041995 | A * | 2/2006 |
| WO | 2013177425 | A1 | 11/2013 |

OTHER PUBLICATIONS

G. Ge, C. Zhang, G. Hoogzaad, and K. Makinwa, "A single-trim CMOS bandgap reference with a 3 inaccuracy of 0.15% from 40C to 125C," IEEE JSSC, vol. 46, No. 11 2011.

P. Malcovati, F. Maloberti, C. Fiocchi, M. Pruzzi, "Curvature-compensated BiCMOS bandgap with 1-V supply voltage", IEEE J. Solid-State Circuits, vol. 36, pp. 1076-1081, Jul. 2001.

R. J. Widlar, "New developments in IC voltage regulators," IEEE Journal of Solid-State Circuits, vol. SC-6, No. 1, pp. 2-7, Feb. 1971.

EP Search Report and Written Opinion for co-pending EP Appl. No. 21152327.9 dated Jun. 14, 2021 (11 pages).

* cited by examiner

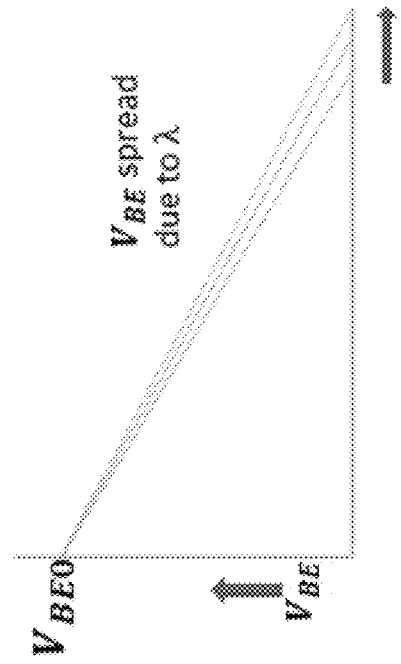
FIG. 1A
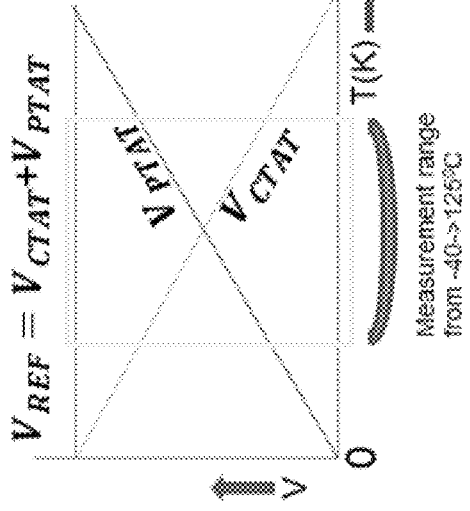
FIG. 1B
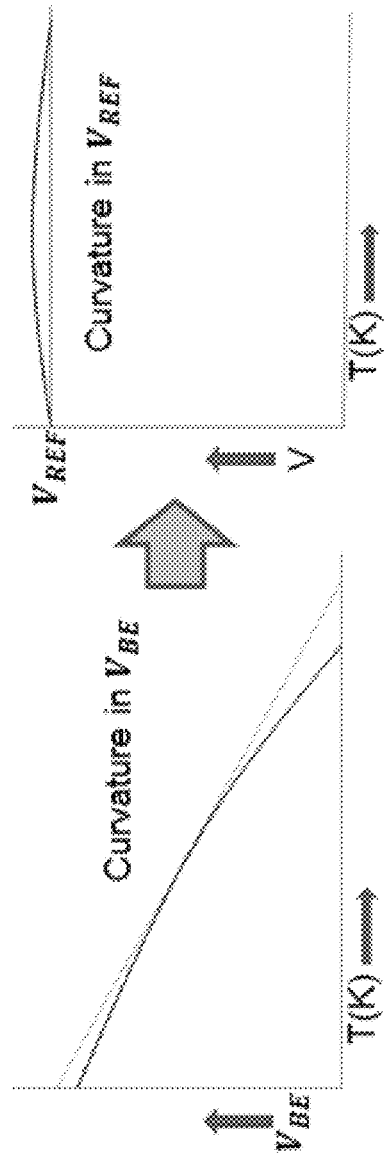
FIG. 1C
FIG. 1D
FIG. 1E
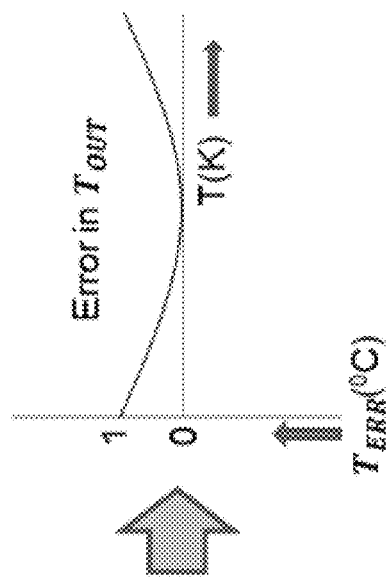

(Sampling Phase Operation when Bitstream=1)

(Integration Phase Operation when Bitstream=1)

(Sampling Phase Operation when Bitstream=0)

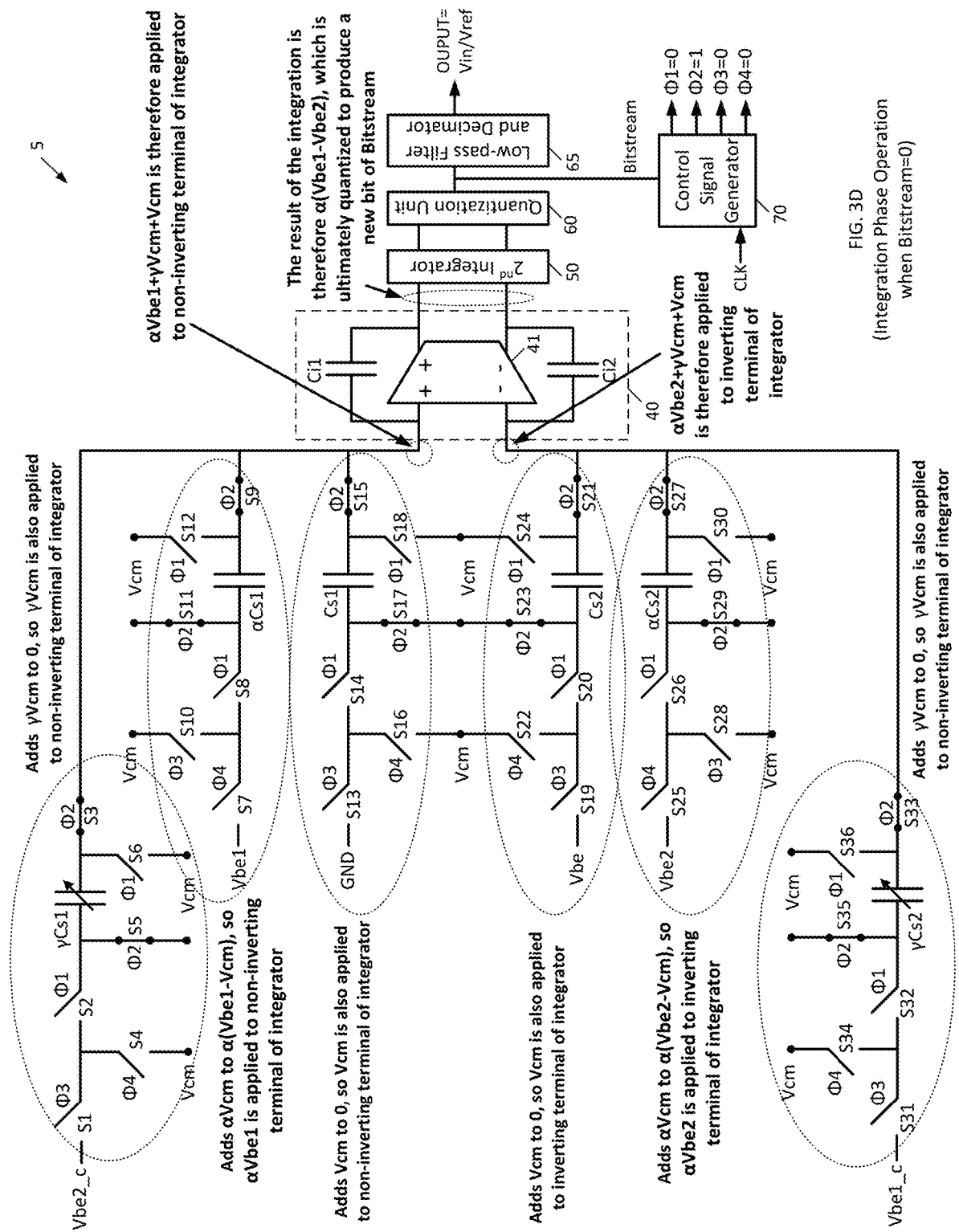
FIG. 3D (Integration Phase Operation when Bitstream=0)

_US 11,892,360 B2_

CONTROLLED CURVATURE CORRECTION IN HIGH ACCURACY THERMAL SENSOR

RELATED APPLICATION

This application claims priority to U.S. Provisional Application for Patent No. 62/968,539, filed Jan. 31, 2020, the contents of which are incorporated by reference.

TECHNICAL FIELD

This application is directed to the field of temperature sensing circuits and, in particular, to a temperature sensing circuit utilizing a sigma-delta based analog to digital converter to produce a highly accurate temperature value from which the temperature of the integrated circuit chip into which the temperature sensing circuit is placed can be determined.

BACKGROUND

Systems on a chip (SOCs) are used in mobile devices such as smartphones and tablets, as well as in numerous embedded systems. Some current SOCs are capable of temperature-aware task scheduling, as well as self-calibration with respect to temperature to help reduce power consumption. In order to enable this functionality, such SOCs include on-chip temperature sensors integrated with other components of the SOCs.

A voltage proportional to absolute temperature Vptat can be produced as the difference between the base-emitter junction voltages of two bipolar junction transistors biased at different current densities. Mathematically, this can be represented as: Vptat=ΔVbe=Vbe1−Vbe2. This voltage proportional to absolute temperature Vptat is relatively error free, because the errors in Vbe1 and Vbe2 due to lack of ideal performance of the transistors cancel each other out.

The relationship between Vptat and temperature can be mathematically represented as $$Vptat = \frac{kT}{q}\ln(p),$$

where T is the temperature in Kelvin, where k is the Boltzmann constant, q is the magnitude of the charge of an electron, and p is the ratio of the current densities of the bipolar junction transistors used to generate Vptat. An analog to digital converter (ADC) digitizes Vptat with respect to a reference voltage Vref and, as a result, outputs a ratio μ that can be calculated as $$\mu = \frac{Vptat}{Vref}.$$

This ratio can be scaled appropriately to yield a digital temperature reading in a desired unit, for example: Temperature (C°)=A*μ+B, where A and B are constants.

The accuracy of this temperature reading is dependent primarily upon the temperature independence of the reference voltage Vref. To achieve temperature independence, the reference voltage Vref is typically generated as the sum of the voltage proportional to absolute temperature Vptat and a voltage complementary to absolute temperature Vctat, as can be seen in FIG. 1A, which in ideal conditions, would produce a truly temperature independent reference voltage.

The voltage complementary to absolute temperature Vctat is produced as the base-emitter junction voltage Vbe of a bipolar junction transistor. However, due to the lack of ideal performance of the transistor, errors are introduced. Mathematically, the real world Vbe produced can be represented as: Vbe=Vbe$_0$−λT+C(T), where Vbe$_0$ is the value of Vbe at 0° K, λ is the slope of decay of Vbe0 with temperature, and C(T) is a non-linear quantity.

The slope λ is process dependent and, therefore, introduces inaccuracy in Vbe. A sample spread of Vbe values resulting from different values of the slope λ can be seen in FIG. 1B, in which it can be noted that the inaccuracy introduced into Vbe by the slope λ is linear. Since this inaccuracy is linear, it can easily be corrected for via calibration.

C(T), as stated, is a non-linear quantity, and is responsible for non-linear curvature present in Vctat over temperature. C(T) can be mathematically represented as:

$$C(T) = \left(\frac{k}{q}\right)(n-m)\left(T - T_r - T*\ln\left(\frac{T}{Tr}\right)\right)$$

where k is Boltzmanns's constant, q is the magnitude of the charge of an electron, n is generally 4 for silicon, T is the temperature in Kelvin, m is the proportionality of the bias current to the power of T (Ibias∝T$^m$), and Tr is a reference temperature.

The non-linear inaccuracy introduced by C(T) into Vbe can be seen in FIG. 1C, where Vbe becomes curved (e.g., has a non-linear slope) over temperature. Since Vref is calculated as Vctat+Vptat, keeping in mind that Vctat=Vbe, since Vptat is relatively error free, the curvature in Vctat produces a temperature dependent curvature in Vref as can be seen in FIG. 1D. Since the ratio $$\mu = \frac{Vptat}{Vref}$$

is used to calculate the output temperature, it can therefore be appreciated that curvature in Vref produces a non-linear error in the output temperature, as shown in FIG. 1E.

Attempts have been made at correcting this error and generating a truly temperature independent reference voltage. For example, a first prior art design is disclosed in "Curvature-compensated BiCMOS bandgap with 1-V supply voltage" by P. Malcovati, F. Maloberti, C. Fiocchi, and M. Pruzzi in IEEE Journal of Solid-State Circuits, vol. 36, pp. 1076-01081, July 2001 (incorporated by reference). However, this design utilizes an operational amplifier to add a compensation voltage, and the offset of the operational amplifier itself introduces error to this compensation voltage. A second prior art design is disclosed in "A single-trim CMOS bandgap reference with a 3σ inaccuracy of 0.15% from 40 C to 125 C" by G. Ce, C. Zhang, G. Hoogezand, and K. Makinwa in Solid-State Circuits Conference Digest of Technical Papers (ISSCC) pp. 78-79, 2010 IEEE International, February 2010 (incorporated by reference). However, this design suffers from similar drawbacks as the first prior art design discussed above.

Therefore, the attempts to date at correcting the non-linearity in Vctat (and therefore Vref) over temperature are insufficient at properly eliminating said non-linearity, and further development is needed. In particular, a design capable of adding a highly precise compensation voltage is desired, for example by using sigma-delta modulation to add the compensation voltage.

SUMMARY

Disclosed herein is a temperature sensing circuit including voltage generation circuitry. The voltage generation circuitry includes: first and second bipolar junction transistors having coupled collectors and bases, and biased at different current densities; a third bipolar junction transistor having its collector coupled to its base, the third bipolar junction transistor biased by a calibrated current and having a base-emitter voltage that is a voltage complementary to absolute temperature, the voltage complementary to absolute temperature having a curved non-linearity across temperature; and fourth and fifth bipolar junction transistors having coupled collectors and bases, the fifth bipolar junction transistor biased by a temperature independent constant current, the fourth bipolar junction transistor biased by a current proportional to absolute temperature. The temperature sensing circuit also includes a switched capacitor circuit configured to selectively sample voltages produced by the voltage generation circuitry and provide the sampled voltages to inputs of an integrator, and a quantization circuit configured to quantize outputs of the integrator to produce a bitstream. The switched capacitor circuit cooperates with the integrator under control of the bitstream to: when a most recent bit of the bitstream is a logic zero, cause integration of a difference between a base-emitter voltage of the first bipolar junction transistor and a base-emitter voltage of the second bipolar junction transistor to thereby produce a voltage proportional to absolute temperature; and when the most recent bit of the bitstream is a logic one, cause integration of a difference between a base-emitter voltage of the fourth bipolar junction transistor and a sum of the voltage complementary to absolute temperature and a base-emitter voltage of the fifth bipolar junction transistor to thereby produce a negative voltage complementary to absolute temperature having negligible non-linearity across temperature. The temperature sensing circuit also includes a low pass filter and decimator configured to filter and decimate the bitstream produced by the quantization circuit to produce a voltage indicative of a temperature of a chip into which the temperature sensing circuit is placed.

The switched capacitor circuit may also include: a first variable capacitance used to sample and hold the base-emitter voltage of the fourth bipolar junction transistor, the first variable capacitance including a number $\gamma$ of parallel connected capacitors of a same capacitance; a second variable capacitance used to sample and hold the base-emitter voltage of the fifth bipolar junction transistor, the second variable capacitance including $\gamma$ parallel connected capacitors of a same capacitance, wherein $\gamma$ is selected such that the curved non-linearity across temperature in the voltage complementary to absolute temperature is canceled out during integration of the difference between the base-emitter voltage of the fourth bipolar junction transistor and a sum of the voltage complementary to absolute temperature and the base-emitter voltage of the fifth bipolar junction transistor; a third variable capacitance used to sample and hold the base-emitter voltage of the first bipolar junction transistor, the third variable capacitance including a number $\alpha$ of parallel connected capacitors of a same capacitance; a first fixed capacitance used to sample and hold ground; a second fixed capacitance used to sample and hold the base-emitter voltage of the third bipolar junction transistor; and a fourth variable capacitance used to sample and hold the base-emitter voltage of the second bipolar junction transistor, the fourth variable capacitance including $\alpha$ parallel connected capacitors of a same capacitance.

The switched capacitor circuit may also include: a first switch having a first node coupled to the base-emitter voltage of the fourth bipolar junction transistor, wherein the first switch operates in response to a third control signal; a second switch having a first node coupled to a second node of the first switch and a second node coupled to a first node of the first variable capacitance, wherein the second switch operates in response to a first control signal; a third switch having a first node coupled to a second node of the first variable capacitance and a second node coupled to a non-inverting input of the integrator, wherein the third switch operates in response to a second control signal; a fourth switch having a first node coupled to the second node of the first switch and a second node coupled to a common mode voltage, wherein the fourth switch operates in response to a fourth control signal; a fifth switch having a first node coupled to the first node of the first variable capacitance and a second node coupled to the common mode voltage, wherein the fifth switch operates in response to the second control signal; and a sixth switch having a first node coupled to the second node of the first variable capacitance and a second node coupled to the common mode voltage, wherein the sixth switch operates in response to the first control signal.

The switched capacitor circuit may also include: a seventh switch having a first node coupled to the base-emitter voltage of the first bipolar junction transistor, wherein the seventh switch operates in response to the fourth control signal; an eighth switch having a first node coupled to a second node of the seventh switch and a second node coupled to a first node of the third variable capacitance, wherein the eighth switch operates in response to the first control signal; a ninth switch having a first node coupled to a second node of the third variable capacitance and a second node coupled to the non-inverting input of the integrator, wherein the ninth switch operates in response to the second control signal; a tenth switch having a first node coupled to the second node of the seventh switch and a second node coupled to the common mode voltage, wherein the tenth switch operates in response to the third control signal; an eleventh having a first node coupled to the first node of the third variable capacitance and a second node coupled to the common mode voltage, wherein the eleventh switch operates in response to the second control signal; and a twelfth having a first node coupled to the second node of the third variable capacitance and a second node coupled to the common mode voltage, wherein the twelfth switch operates in response to the first control signal.

The switched capacitor circuit may also include: a thirteenth switch having a first node coupled to ground, wherein the thirteenth switch operates in response to the third control signal; a fourteenth switch having a first node coupled to a second node of the thirteenth switch and a second node coupled to a first node of the first fixed capacitance, wherein the fourteenth switch operates in response to the first control signal; a fifteenth switch having a first node coupled to a second node of the first fixed capacitance and a second node coupled to the non-inverting terminal of the non-inverting input of the integrator, wherein the fifteenth switch operates in response to the second control signal; a sixteenth switch having a first node coupled to the second node of the thirteenth switch and a second node coupled to the common mode voltage, wherein the sixteenth switch operates in response to the fourth control signal; a seventeenth switch having a first node coupled to the first node of the first fixed capacitance and a second node coupled to the common mode voltage, wherein the seventeenth switch operates in response to the second control signal; and an eighteenth switch having a first node coupled to the second node of the first fixed capacitance and a second node coupled to the common mode voltage, wherein the eighteenth switch operates in response to the first control signal.

The switched capacitor circuit may also include: a nineteenth switch having a first node coupled to the base-emitter voltage of the third bipolar junction transistor, wherein the nineteenth switch operates in response to the third control signal; a twentieth switch having a first node coupled to a second node of the nineteenth switch and a second node coupled to a first node of the second fixed capacitance, wherein the twentieth switch operates in response to the first control signal; a twenty first switch having a first node coupled to a second node of the second fixed capacitance and a second node coupled to the inverting input of the integrator, wherein the twenty first switch operates in response to the second control signal; a twenty second switch having a first node coupled to the second node of the nineteenth switch and a second node coupled to the common mode voltage, wherein the twenty second switch operates in response to the fourth control signal; a twenty third switch having a first node coupled to the first node of the second fixed capacitance and a second node coupled to the common mode voltage, wherein the twenty third switch operates in response to the second control signal; and a twenty fourth switch having a first node coupled to the second node of the second fixed capacitance and a second node coupled to the common mode voltage, wherein the twenty fourth switch operates in response to the first control signal.

The switched capacitor circuit may also include: a twenty fifth switch having a first node coupled to the base-emitter voltage of the second bipolar junction transistor, wherein the twenty fifth switch operates in response to the fourth control signal; a twenty sixth switch having a first node coupled to a second node of the twenty fifth switch and a second node coupled to a first node of the fourth variable capacitance, wherein the twenty sixth switch operates in response to the first control signal; a twenty seventh switch having a first node coupled to a second node of the fourth variable capacitance and a second node coupled to the inverting input of the integrator, wherein the twenty seventh switch operates in response to the second control signal; a twenty eighth switch having a first node coupled to the second node of the twenty fifth switch and a second node coupled to the common mode voltage, wherein the twenty eighth switch operates in response to the third control signal; a twenty ninth switch having a first node coupled to the first node of the fourth variable capacitance and a second node coupled to the common mode voltage, wherein the twenty ninth switch operates in response to the second control signal; and a thirtieth switch having a first node coupled to the second node of the fourth variable capacitance and a second node coupled to the common mode voltage, wherein the thirtieth switch operates in response to the first control signal.

The switched capacitor circuit may also include: a thirty first switch having a first node coupled to the base-emitter voltage of the fifth bipolar junction transistor, wherein the thirty first switch operates in response to the third control signal; a thirty second switch having a first node coupled to a second node of the thirty first switch and a second node coupled to a first node of the second variable capacitance, wherein the thirty second switch operates in response to the first control signal; a thirty third switch having a first node coupled to a second node of the second variable capacitance and a second node coupled to the non-inverting input of the integrator, wherein the thirty third switch operates in response to the second control signal; a thirty fourth switch having a first node coupled to the second node of the thirty first switch and a second node coupled to the common mode voltage, wherein the thirty fourth switch operates in response to the fourth control signal; a thirty fifth switch having a first node coupled to the first node of the second variable capacitance and a second node coupled to the common mode voltage, wherein the thirty fifth switch operates in response to the second control signal; and a thirty sixth switch having a first node coupled to the second node of the second variable capacitance and a second node coupled to the common mode voltage, wherein the thirty sixth switch operates in response to the first control signal.

The temperature sensor may also include a control signal generator configured, when the most recent bit of the bitstream is a logic zero: in a sampling phase, to assert the first control signal and fourth control signal, while deasserting the second and third control signals; and in an integration phase, to assert the second control signals while deasserting the first, third, and fourth control signals.

The control signal generator may also be configured, when the most recent bit of the bitstream is a logic one: in a sampling phase, to assert the first control signal and third control signal, while the second and fourth control signals; and in an integration phase, to assert the second control signal, while deasserting the first, third, and fourth control signals.

Also disclosed herein is a temperature sensing circuit including: a switched capacitor circuit configured to selectively sample voltages produced by voltage generation circuitry and provide the sampled voltages to inputs of an integrator; and a quantization circuit configured to quantize outputs of the integrator to produce a bitstream; wherein the switched capacitor circuit cooperates with the integrator under control of the bitstream to cause integration of a first voltage, or cause addition of a correction voltage to a second voltage to produce a corrected voltage and then integrate the corrected voltage, depending on a most recent bit of the bitstream.

The switched capacitor circuit may include: a first variable capacitance used to sample and hold a first component of the correction voltage, the first variable capacitance including a number $\gamma$ of parallel connected capacitors of a same capacitance; and a second variable capacitance used to sample and hold a second component of the correction voltage, the second variable capacitance including $\gamma$ parallel connected capacitors of a same capacitance. $\gamma$ may be selected such that non-linearity in the second voltage is canceled out during production of the corrected voltage and integration of the corrected voltage.

The switched capacitor circuit may also include: a third variable capacitance used to sample and hold a first component of the first voltage, the third variable capacitance including a number $\alpha$ of parallel connected capacitors of a same capacitance; and a fourth variable capacitance used to sample and hold a second component of the first voltage, the fourth variable capacitance including $\alpha$ parallel connected capacitors of a same capacitance.

The switched capacitor may cause integration of the first voltage when the most recent bit of the bitstream is a first value and cause integration of the corrected voltage when the most recent bit of the bitstream of a second voltage.

The first value may be a logical zero and the second value may be a logical one.

BRIEF DESCRIPTION OF THE DRAWINGS

FIG. 1A is a graph showing generation of a temperature independent reference voltage (Vref) in a prior art temperature sensor by summing a voltage proportional to absolute temperature (Vptat) and a voltage complementary to absolute temperature (Vctat).

FIG. 1B is a graph showing how the slope of the voltage of the base-emitter junction of the bipolar junction transistor used to generate Vctat (also referred to as Vbe) across temperature is process dependent (varies from transistor to transistor due to process variation).

FIG. 1C is a graph showing curvature in a graph of the voltage complementary to absolute temperature across temperature present due to lack of ideality of the bipolar junction transistor generating the voltage complementary to absolute temperature.

FIG. 1D is a graph showing the curvature in a graph of the temperature independent reference voltage across temperature that results from the curvature in the voltage complementary to absolute temperature.

FIG. 1E is a graph showing the error in the temperature output produced by the prior art temperature sensor, resulting from the curvature in the temperature independent reference voltage.

FIG. 3D shows the design of FIG. 2 operating in an integration phase when the previously output bit of the generated bitstream was a logic 0.

DETAILED DESCRIPTION

Figure 2:
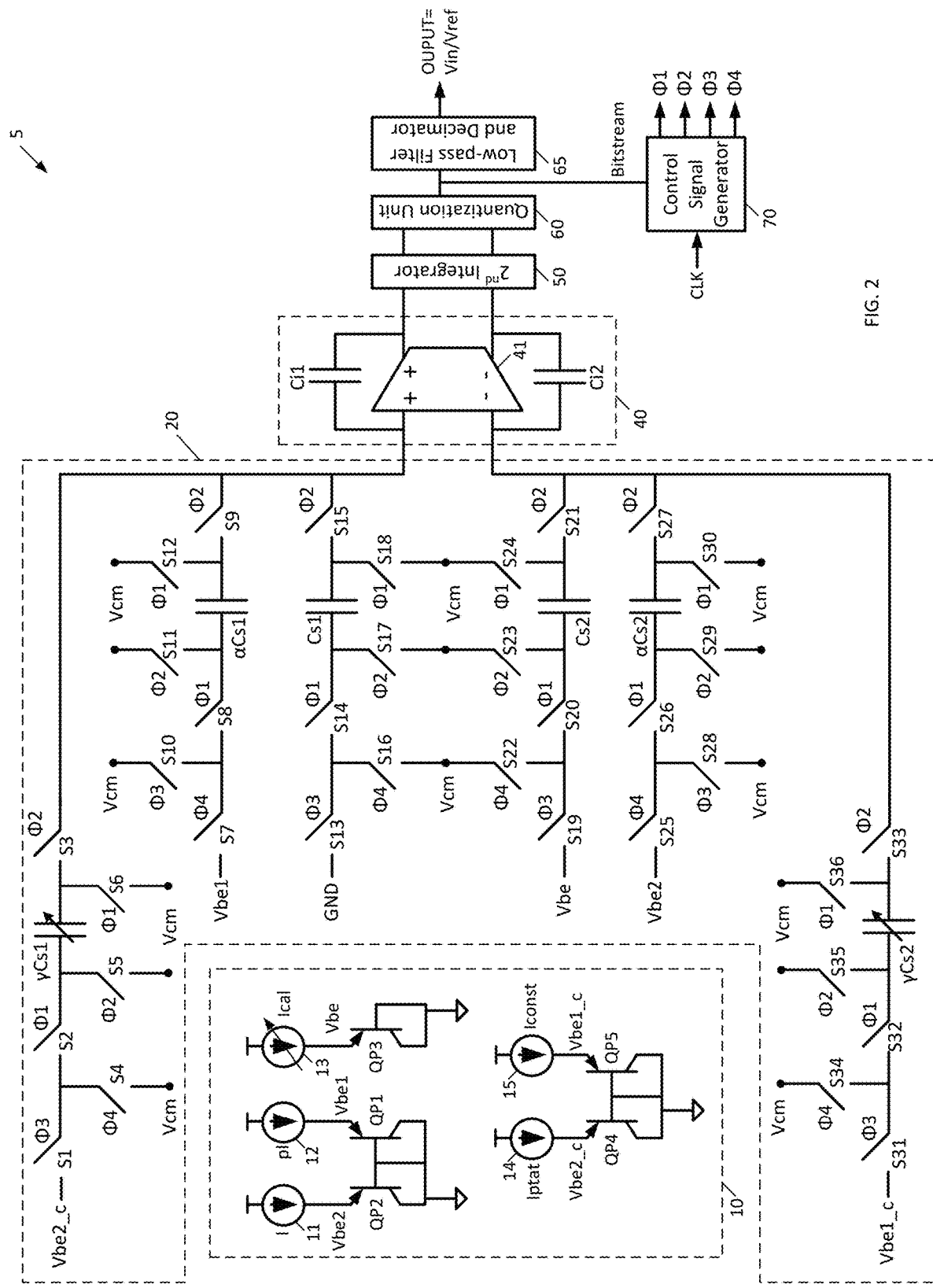
FIG. 2 is a detailed schematic diagram of an on-chip temperature sensor utilizing a sigma-delta analog to digital converter, in accordance with this disclosure.

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

In general, the temperature sensor circuit disclosed herein generates a first base-emitter junction voltage (Vbe1) of a first bipolar junction transistor biased at a first current density (I), a second base-emitter junction voltage (Vbe2) of a second bipolar junction transistor having its base and collector coupled to those of the first bipolar junction transistor and being biased at a second current density (pI), and a third base-emitter junction voltage (Vbe) of a third bipolar junction transistor biased with a calibrated current (Ical) and having non-linear curvature present over temperature.

In addition, the temperature sensor circuit generates a first corrected base-emitter junction voltage (Vbe1_c) of a fourth bipolar junction transistor biased by a temperature independent constant current (Iconst), and a second corrected base-emitter junction voltage (Vbe2_c) of a fifth bipolar junction transistor having its base and collector coupled to those of the fourth bipolar junction transistor and being biased by a current proportional to absolute temperature (Iptat).

A switched capacitor sigma-delta modulated (SDM) analog to digital converter (ADC) samples its input voltage and converts it into a digital bitstream (1s and 0s) by employing a loop filter based on switched capacitor integrator blocks. The order of the loop filter depends on the number of integrators used. The output of the loop filter is then processed by a quantizer to produce a bitstream. This bitstream is used to apply appropriate feedback to complete a negative feedback loop. In the input sampling circuit to the first integrator, a reference voltage is sampled and subtracted from the sampled input voltage, depending on the previously generated bit of the bitstream. This complete loop encodes the bitstream in the time-domain in such a way that an appropriate digital decimation filter can generate a digital code corresponding to an exact representation of ratio of input voltage to the reference voltage from the bitstream.

In the thermal sensor disclosed herein, the input sampling circuit of the SDM based ADC can be used to sample an input voltage, which is a voltage proportional to absolute temperature (Vptat), from Vbe1 and Vbe2. The input sampling circuit of the SDM can also equivalently generate a temperature independent reference voltage (Vref) by sampling Vptat along with a corrected voltage complementary to absolute temperature (Vctat_c) by addition of Vbe and the difference between Vbe1_c and Vbe2_c. The corrected voltage complementary to absolute temperature Vctat_c has negligible non-linear curvature present over temperature, as does the reference voltage Vref produced from the addition of Vbe to the difference between Vbe1_c and Vbe2_c.

Any amount of scaling which is required to compensate Vptat and Vctat_c can be incorporated by using proper ratio of sampling capacitors. For this thermal sensor employing sigma-delta modulation, the ADC's input voltage Vptat is used, and for reference both Vptat and Vctat_c are used. Exploiting the sigma-delta modulation principle, Vptat can be sampled as the input voltage, which is subtracted by the bitstream dependent sampled reference voltage. Therefore, the sampling voltage can be Vptat or (Vptat−Vref) depending on whether the previously generated bit of bitstream was 0 or 1 respectively. This sampled voltage can be integrated and processed further in the loop filter and quantizer to generate the bitstream. The bitstream produced by the quantizer is used to suitably operate the switches of the switched capacitor circuits so as to achieve sampling and integration of Vptat and Vref in a fashion that yields a sigma-delta coded bitstream that, after filtering and decimation over a given window of time, represents a digital code that can be scaled appropriately to yield a digital temperature reading in a desired unit.

The structure of the temperature sensor circuit 5 is now described in detail with reference to FIG. 2, and thereafter operation of the temperature sensor circuit 5 will be described with reference to FIGS. 3A-3D.

A. Structure of Temperature Sensor Circuit

The temperature sensor circuit 5 is arranged to include a sigma-delta modulated analog to digital converter (ADC). The temperature sensor circuit 5 includes an analog voltage generation circuit 10, a switched capacitor input sampling circuit 20 which has inputs receiving the voltages generated by the analog voltage generation circuit 10 and outputs coupled to non-inverting and inverting terminals of a first integrator 40. The first integrator 40 has outputs coupled to inputs of a second integrator 50, which in turn has outputs coupled to inputs of a quantization circuit 60. The quantization circuit 60 produces a Bitstream that is fed to a control signal generator 70 and a low-pass filtering and decimation circuit 65. The control signal generator 70 generates control signals $\phi 1$, $\phi 2$, $\phi 3$, and $\phi 4$ in response to the logic state of bits of the Bitstream, where the control signals control switching actuation of the various switches of the switched capacitor input sampling circuit 20. The low-pass filtering and decimation circuit 65 produces an output code which can be used to calculate the temperature of the chip into which the temperature sensor circuit 5 is integrated, in a desired unit.

In detail, the analog voltage generation circuit 10 includes bipolar junction PNP transistors QP1 and QP2 having their collectors and bases connected to ground. The emitter of QP2 is connected to a current source 11 to receive the current I, and the emitter of QP1 is connected to a current source 12 to receive the current pI (meaning that the magnitude of the current pI is equal to the magnitude of the current I, scaled by a factor p). Voltage Vbe1, the voltage of the base-emitter junction of transistor QP1, is produced at the emitter of transistor QP1. Likewise, voltage Vbe2, the voltage of the base-emitter junction of transistor QP2, is produced at the emitter of transistor QP2.

The analog voltage generation circuit 10 also includes PNP transistor QP3 having its collector and base connected to ground, and its emitter connected to a current source 13 to receive a calibrated current Ical (calibrated to negate the effect of the process dependent parameter $\lambda$). Voltage Vbe, the voltage of the base-emitter junction of transistor QP3, is produced at the emitter of transistor QP3. The voltage Vbe is complementary to absolute temperature and can therefore be referred to as Vctat. The voltage Vctat, as explained and understood by those skilled in the art, has a non-linear curvature present over temperature due to unideal performance of the PNP transistor QP3.

The signal generation circuit 10 also includes PNP transistors QP4 and QP5 having their collectors and bases connected to ground. The emitter of transistor QP4 is connected to a current source 14 to receive a current Iptat which is proportional to absolute temperature, and the emitter of transistor QP5 is connected to a current source 15 to receive a current Iconst which is constant with respect to temperature. Voltage Vbe1_c is the voltage of the base-emitter junction of transistor QP5, and is referred to herein as "Vbe1 corrected", and voltage Vbe2_c is the voltage of the base-emitter junction of transistor QP4 and is referred to herein as "Vbe2 corrected". As will be explained below, a voltage equal to Vbe2_c−Vbe1_c is a non-linear compensation voltage Vnl that has a non-linear curvature over temperature that has the same nature as the curvature present in the voltage Vctat.

The switched capacitor input sampling circuit 20 includes a switch S1 (closed when control signal $\Phi 3$ is logic high, and open otherwise) to selectively connect voltage Vbe2_c to a first node of the switch S2 (closed when control signal $\Phi 1$ is logic high, and open otherwise). A first node of an adjustable capacitance $\gamma$Cs1 (wherein this adjustable capacitance may, for example, be formed by $\gamma$ parallel connected capacitors each having a capacitance of Cs1, with the number $\gamma$ being settable) is connected to a second node of the switch S2. A switch S3 (closed when control signal $\Phi 2$ is logic high, and open otherwise) selectively connects a second node of the adjustable capacitance $\gamma$Cs1 to the non-inverting terminal of the first integrator 40. A switch S4 (closed when control signal $\Phi 4$ is logic high, and open otherwise) selectively connects the first node of switch S2 to a common mode voltage Vcm. A switch S5 (closed when control signal $\Phi 2$ is logic high, and open otherwise) selectively connects the first node of the adjustable capacitance $\gamma$Cs1 to a common mode voltage Vcm, and a switch S6 (closed when control signal $\Phi 1$ is logic high, and open otherwise) selectively connects the second node of the adjustable capacitance $\gamma$Cs1 to the common mode voltage Vcm.

The switched capacitor input sampling circuit 20 includes a switch S7 (closed when control signal $\Phi 4$ is high, and open otherwise) to selectively connect voltage Vbe1 to a first node of switch S8 (closed when control signal $\Phi 1$ is high, and open otherwise). A first node of an adjustable capacitance $\alpha$Cs1 (wherein this adjustable capacitance may, for example, be formed by a parallel connected capacitors each having a capacitance of Cs1, with the number $\alpha$ being settable) is connected to a second node of the switch S8. A switch S9 (closed when control signal $\Phi 2$ is high, and open otherwise) selectively connects a second node of the adjustable capacitance $\alpha$Cs1 to the non-inverting terminal of the first integrator 40. A switch S10 (closed when control signal $\Phi 3$ is high, and open otherwise) selectively connects the first node of the switch S8 to the common mode voltage Vcm. A switch S11 (closed when control signal $\Phi 2$ is high, and open otherwise) selectively connects the first node of the adjustable capacitance $\alpha$Cs1 to the common mode voltage Vcm. A switch S12 (closed when the control signal $\Phi 1$ is high, and open otherwise) selectively connects the second node of the adjustable capacitance $\alpha$Cs1 to the common mode voltage Vcm.

The switched capacitor input sampling circuit 20 includes a switch S13 (closed when control signal $\Phi 3$ is logic high, and open otherwise) to selectively connect ground to a first node of switch S14 (closed when control signal $\Phi 1$ is logic high, and closed otherwise). A second node of switch S14 is connected to a first node of capacitor Cs1. Switch S15 (closed when control signal $\Phi 2$ is logic high, and open otherwise) selectively connects a second node of the capacitor Cs1 to the non-inverting input of the first integrator 40. A switch S16 (closed when control signal $\Phi 4$ is a logic high, and open otherwise) selectively connects the first node of the switch S14 to the common mode voltage Vcm. A switch S17 (closed when control signal $\Phi 2$ is logic high, and open otherwise) selectively connects the first node of the capacitor Cs1 to the common mode voltage Vcm, and a switch S18 (closed when control signal $\Phi 1$ is a logic high, and open otherwise) selectively connects the second node of the capacitor Cs2 to the common mode voltage Vcm.

A switch S19 (closed when the control signal $\Phi 3$ is logic high, and open otherwise) selectively connects the voltage Vbe to a first node of the switch S20 (closed when the control signal $\Phi 1$ is a logic high, and open otherwise). A second node of the switch S20 is connected to a first node of a capacitor Cs2. A switch S21 (closed when the control signal $\Phi 2$ is a logic high, and open otherwise) selectively connects a second node of the capacitor Cs2 to the inverting terminal of the first integrator 40. A switch S22 (closed when the control signal Φ4 is a logic high, and open otherwise) selectively connects the first node of the switch S20 to the common mode voltage Vcm. A switch S23 (closed when the control signal Φ2 is a logic high, and open otherwise) selectively connects the first node of the capacitor Cs2 to the common mode voltage Vcm. A switch S24 (closed when the control signal Φ1 is a logic high, and open otherwise) selectively connects the second node of the capacitor Cs2 to the common mode voltage Vcm.

A switch S25 (closed when the control signal Φ4 is a logic high, and open otherwise) selectively connects the voltage Vbe2 to a first node of the switch S26 (closed when the control signal Φ1 is a logic high, and open otherwise). A second node of the switch S26 is connected to a first node of an adjustable capacitance αCs2 (wherein this adjustable capacitance may, for example, be formed by α parallel connected capacitors each having a capacitance of Cs2, with the number α being settable). A second node of the adjustable capacitance αCs2 is selectively connected to the inverting terminal of the first integrator by a switch S27 (closed when the control signal Φ2 is a logic high, and open otherwise). A switch S28 (closed when the control signal Φ3 is a logic high, and open otherwise) selectively connects the first node of the switch S26 to the common mode voltage Vcm. A switch S29 (closed when the control signal Φ2 is a logic high, and open otherwise) selectively connects the first node of the adjustable capacitance αCs2 to the common mode voltage. A switch S30 (closed when the control signal Φ1 is a logic high, and open otherwise) selectively connects the second node of the adjustable capacitance αCs2 to the common mode voltage.

A switch S31 (closed when the control signal Φ3 is a logic high, and open otherwise) selectively connects the voltage Vbe1_c to a first node of the switch S32 (closed when the control signal Φ1 is a logic high, and open otherwise). A second node of the switch S32 is connected to a first node of an adjustable capacitance γCs2 (wherein this adjustable capacitance may, for example, be formed by γ parallel connected capacitors each having a capacitance of Cs2, with the number γ being settable). A second node of the adjustable capacitance γCs2 is selectively connected to the inverting terminal of the first integrator 40 by a switch S33 (closed when the control signal Φ2 is a logic high, and open otherwise). A switch S34 (closed when the control signal Φ4 is a logic high, and open otherwise) selectively connects the first node of the switch S32 to the common mode voltage Vcm. A switch S35 (closed when the control signal Φ2 is a logic high, and open otherwise) selectively connects the first node of the adjustable capacitance γCs2 to the common mode voltage Vcm. A switch S36 (closed when the control signal Φ1 is a logic high, and open otherwise) selectively connects the second node of the adjustable capacitance γCs2 to the common mode voltage Vcm.

The integrator 40 is comprised of an amplifier 41 having a first integration capacitor Ci1 connected between its non-inverting input and its non-inverting output, and a second integration capacitor Ci2 connected between its inverting input and its inverting output. A second integrator 50 has inputs coupled to the non-inverting and inverting outputs of the amplifier 41, and has outputs coupled to the inputs of the quantization circuit 60. The quantization circuit 60 has an output (providing the bitstream) coupled to the low-pass filtering and decimation circuit 65, as well as to the control signal generator 70. As stated, the low-pass filtering and decimation circuit 65 provides an output code, and this output digital code is used to determine the temperature of the chip into which the temperature sensor circuit 5 is integrated. In addition, as also stated, the control signal generator 70 generates new control signal φ1, φ2, φ3, φ4 as a function of the most recently received bit of the bitstream.

B. Function of Temperature Sensor Circuit

First, the theory behind the operation of the temperature sensor circuit 5 is described.

The voltage equal to α*(Vbe1−Vbe2), generated by transistors QP1 and QP2 and the operation of the circuit 20 and first integrator 40, is proportional to absolute temperature and can be referred to as Vptat or α*ΔVbe. The value of a is set by the adjustable capacitances αCs1 and αCs2 in the circuit 20.

The voltage Vbe, generated by transistor QP3, is complementary to absolute temperature and can be referred to as Vctat. Vbe can be mathematically represented as Vbe=Vbe$_0$−λT+C(T), where Vbe$_0$ is the value of Vbe at 0° K, λ is the slope of decay of Vbe0 with temperature, and C(t) is a non-linear quantity. It is the term C(T) that is responsible for non-linear curvature present in Vbe over temperature. C(T) can be mathematically represented as $$C(T) = \left(\frac{k}{q}\right)(n-m)\left(T - T_r - T\ln\left(\frac{T}{Tr}\right)\right),$$

where k is Boltzmann's constant, q is the magnitude of the charge of an electron, n is generally 4 for silicon, T is the temperature in Kelvin, m is the proportionality of the bias current to the power of T (Ibias∝T$^m$), and Tr is a reference temperature.

The voltage Vbe1_c−Vbe2_c, generated by transistors QP4 and QP5 and the operation of the circuit 20, can be referred to as a non-linear correction voltage Vnl, and can be mathematically represented as $$Vnl = \left(\frac{k}{q}\right)T\ln\left(\frac{T}{Tr}\right) + T\ln\left(\frac{\lambda_{bias}Tr}{Vconst}\right),$$

where k is Boltzmann's constant, q is the magnitude of the charge of an electron, T is the temperature in Kelvin, Tr is a reference temperature, Vconst is a constant voltage which is constant with respect to temperature, and $\lambda_{bias}$ is a multiplicative constant i nbias current generation.

Notice that both of the voltages Vbe and Vnl share the same $$T\ln\left(\frac{T}{Tr}\right)$$

term and, due to the natural logarithmic term, it is this term (resulting from unideal behavior of the transistors that generate the voltages Vbe and Vnl) that is responsible for the nonlinearity in the voltages Vbe and Vnl over temperature. By scaling the voltage Vnl by γ=n−m, with n and m here having the same values as n and m do in the C(T) term of Vbe and where value of γ is set by the adjustable capacitances γCs1 and γCs2 in the circuit 20, when the voltage γVnl is added to the voltage Vbe, the $$-(n-m)*T\ln\left(\frac{T}{Tr}\right)$$

term in the C(T) term of Vbe in opposite polarity and advantageously cancels out.

This means that by adding the voltage γVnl to the voltage Vbe, a corrected voltage complementary to absolute temperature Vbe_c=γ(Vbe1_c−Vbe2_c)+Vbe can be produced, which has an almost negligible amount of curvature in the graph of its value across temperature.

By adding the voltage Vbe_c to the voltage α*ΔVbe, a temperature independent reference voltage Vref, which has an almost negligible amount of curvature in the graph of its value across temperature, can be produced.

It is the goal of the temperature sensor circuit 5 to produce a digital code which, taken over a given window of time, represents α*ΔVbe sampled with respect to Vref, which, stated alternatively, is a ratio μ=α*ΔVbe/Vref that can be used in the equation Temperature=A*μ+B, with A and B being constants selected so that Temperature is expressed in a desired unit value, such as Celsius.

To accomplish this, when the most recently generated value of the Bitstream (produced by the quantization circuit 60) is a logical zero, it is desired for the sigma-delta modulated analog to digital converter to sample the voltage α*ΔVbe, and when the most recently generated value of Bitstream is a logical one, it is desired for the sigma-delta modulated analog to digital converter to sample the voltage α*ΔVbe−Vref.

As explained above, the voltage Vref=αΔVbe+Vbe_c. Therefore, expanding the expression α*ΔVbe−Vref yields αΔVbe−αΔVbe−Vbe_c, which simplifies to −Vbe_c. Therefore, when the Bitstream is at a logical one and Vin−Vref is to be sampled, only −Vbe_c needs to be sampled.

Now, operation of the temperature sensor circuit will be described in detail with reference to FIGS. 3A-3D, as well as the timing diagram of FIG. 4. At the receipt of each pulse of the clock signal CLK, the control signal generator 70 generates new values for the control signals Φ1, Φ2, Φ3, and Φ4 based upon the logic value of the most recently received bit of the Bitstream generated by the quantization circuit 60. The control signals Φ1, Φ2, Φ3, and Φ4 are generated so as to effectuate a sampling phase when the clock signal CLK is logic high, and an integration phase when the clock signal CLK is logic low.

Figure 3A:
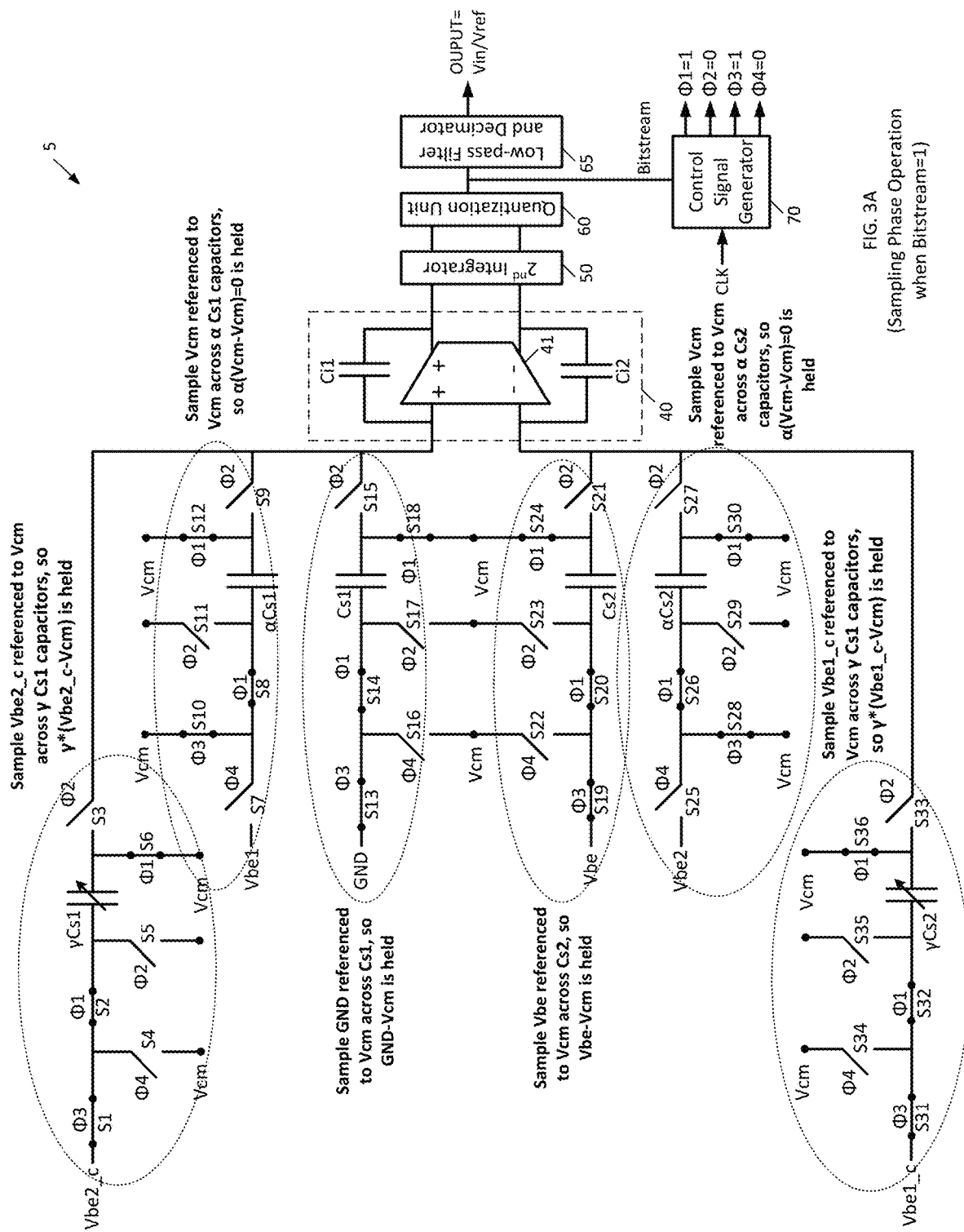
FIG. 3A shows the design of FIG. 2 operating in a sampling phase when the previously output bit of the generated bitstream was a logic 1.

Shown in FIG. 3A is the case where the most recently generated bit of the Bitstream received by the control signal generator 70 is a logic one. In such a case, as shown in FIG. 4, when the clock signal CLK transitions to a logic high and the Bitstream is at a logic one, the control signal generator 70 causes the control signals Φ1 and Φ3 to transition to a logic high and stay logic high until the clock signal CLK transitions to logic low, while maintaining control signals Φ2 and Φ4 logic low, thereby beginning a sampling phase.

This sampling phase is shown in FIG. 3A, where it can be seen that: switches S1, S2, and S6 close to sample the voltage Vbe2_c referenced to the common mode voltage Vcm across the adjustable capacitance γCs1, thereby charging the adjustable capacitance γCs1 to γ*(Vbe2_c−Vcm); switches S13, S14, and S18 close to sample the ground voltage GND referenced to the common mode voltage Vcm across capacitor Cs1, thereby charging the capacitor Cs1 to GND−Vcm; switches S19, S20, and S24 close to sample the voltage Vbe referenced to the common mode voltage Vcm across capacitor Cs2, thereby charging the capacitor Cs2 to Vbe−Vcm; and switched S31, S32, and S36 close to sample the voltage Vbe1_c referenced to the common mode voltage Vcm across the adjustable capacitance γCs2, thereby charging the adjustable capacitance γCs2 to γ*(Vbe1_c−Vcm). In addition, so as to maintain the capacitive loading on the first integrator 40 as uniform across sampling and integration phases: switches S10, S8, and S12 close to sample the common mode voltage Vcm referenced to itself across the adjustable capacitance αCs1, thereby maintaining the adjustable capacitance αCs1 at 0V; and switches S28, S26, and S30 close to sample the common mode voltage Vcm referenced to itself across the adjustable capacitance αCs2, thereby maintaining the adjustable capacitance αCs2 at 0V.

Figure 3B:
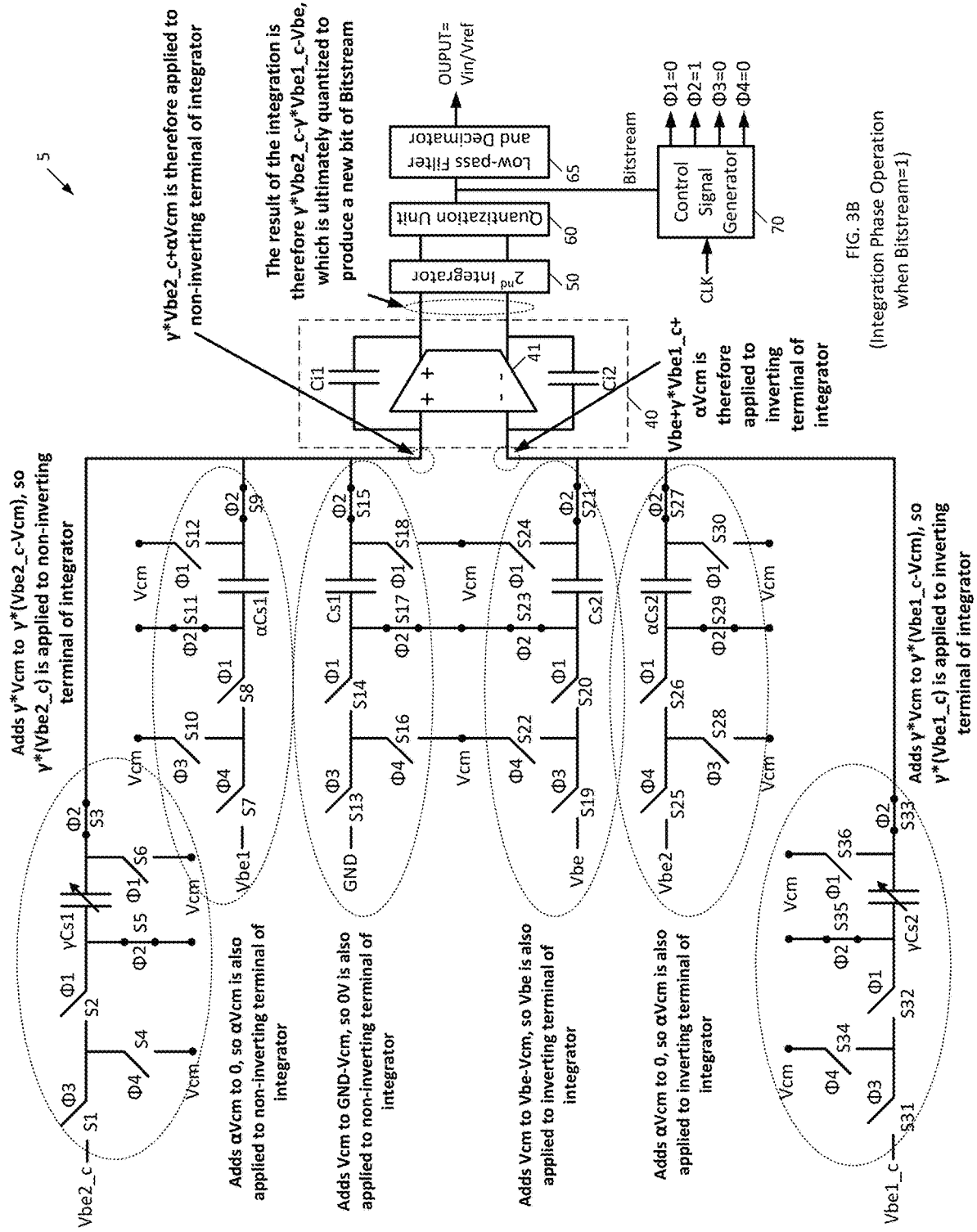
FIG. 3B shows the design of FIG. 2 operating in an integration phase when the previously output bit of the generated bitstream was a logic 1.
Figure 4:
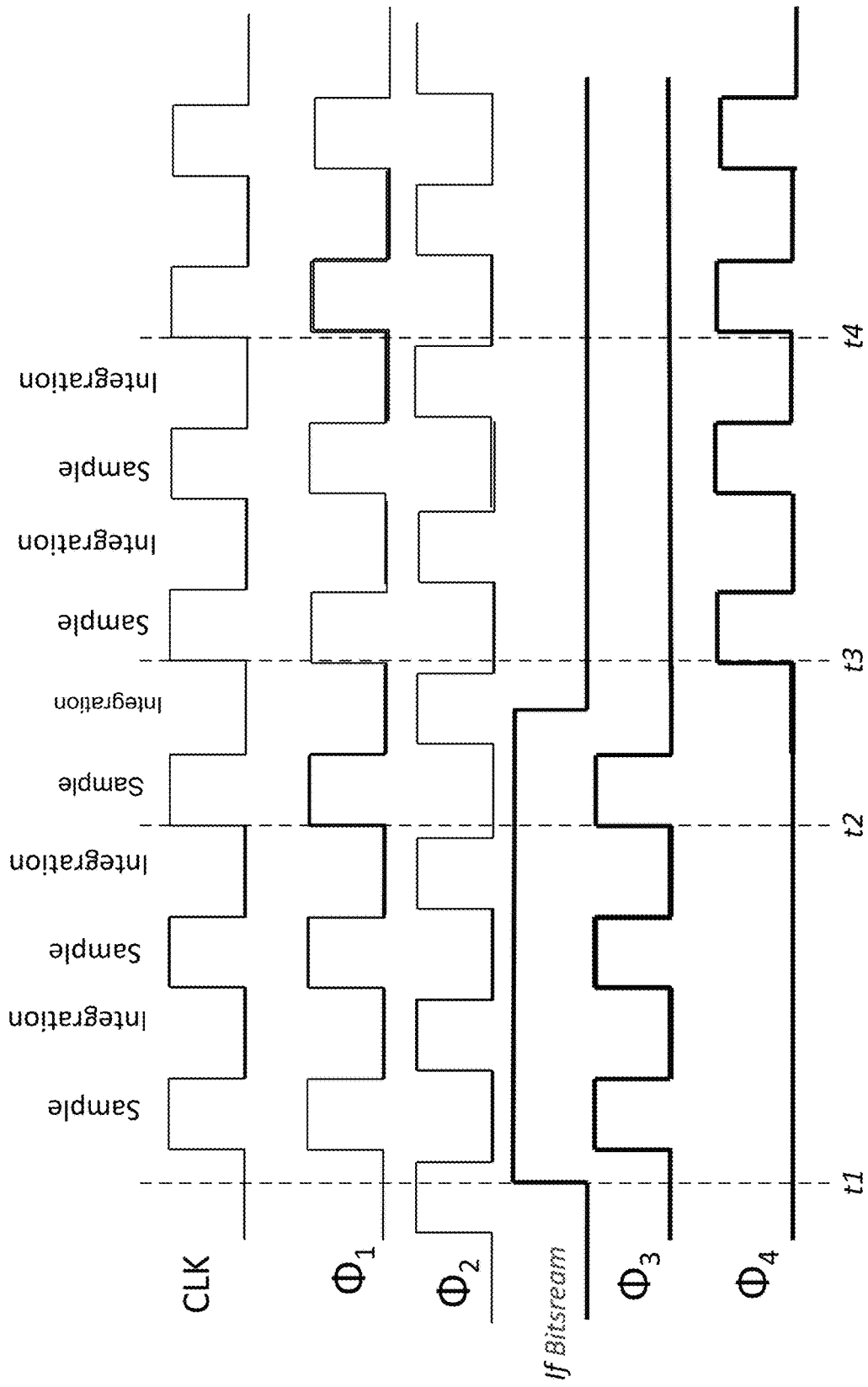
FIG. 4 is a timing diagram showing the timing of controls signals for the switches of FIG. 2 during sampling and integration phases, dependent on the previously output bit of the generated bitstream, to produce operating states shown in FIGS. 3A-3C.

When the clock signal CLK then transitions to logic low, as shown in FIG. 4, the control signal generator 70 then causes the control signals Φ1 and Φ3 to transition to logic low, causes the control signal Φ2 to transition to a logic high, and maintains the control signal Φ4 logic low, thereby beginning an integration phase. This integration phase is shown in FIG. 3B, where it can be seen that: switches S2 and S3 close to add the voltage γVcm to the voltage γ*(Vbe2_c−Vcm) stored across the adjustable capacitance γCs1, thereby applying γ*Vbe2_c to the non-inverting terminal of the first integrator 40; switches S17 and S15 close to add the voltage Vcm to the voltage GND−Vcm stored across the capacitance Cs1, thereby applying 0V to the non-inverting terminal of the first integrator 40; switches S23 and S21 close to add the voltage Vcm to the voltage Vbe−Vcm stored across the capacitance Cs2, thereby applying the voltage Vbe to the inverting terminal of the integrator 40; and switches S35 and S33 close to add the voltage γVcm to the voltage γ*(Vbe1_c−Vcm) stored across the adjustable capacitance γCs2, thereby applying the voltage γ*Vbe1_c to the inverting terminal of the integrator 40.

In addition, so as to maintain the capacitive loading on the first integrator 40 as uniform across sampling and integration phases: switches S11 and S9 close to add αVcm to the 0V stored across the adjustable capacitance αCs1, thereby applying αVcm to the non-inverting terminal of the integrator 40; and switches S29 and S27 close to add αVcm to the 0V stored across the adjustable capacitance αCs2, thereby applying αVcm to the inverting terminal of the integrator 40.

Summing the voltages applied to the non-inverting terminal of the integrator 40 yields the voltage γ*Vbe2_c+αVcm, while summing the voltages applied to the inverting terminal of the integrator 40 yields the voltage Vbe+γ*Vbe1_c+αVcm. The result of the integration performed by the integrator 40 is therefore the voltage γVbe2_c−γVbe1_c−Vbe, assuming the integrator 40 has a unity gain.

As stated above, when the Bitstream is 1, it is desired to sample the voltage −Vbe_c. Since we know the voltage Vbe_c=γ(Vbe1_c−Vbe2_c)+Vbe=γVbe1_c−γVbe2_c+Vbe, this means that the voltage −Vbe_c will be equal to the voltage −γVbe1_c+γVbe2_c−Vbe. Rearranged, this means that the voltage −Vbe_c will be equal to the voltage Vbe2_c−γVbe1_c−Vbe, which as shown immediately above, is the result of the integration performed by the integrator 40 in FIG. 3B.

Therefore, when Bitstream is 1, the integrator 40 integrates the voltage −Vbe_c, as desired. The second integrator 50 performs a further integration of the voltage −Vbe_c, which is then quantized to generate a next bit of the Bitstream by the quantization circuit 60. This next bit of the Bitstream will be used by the control signal generator 70 to generate new values of control signals Φ1, Φ2, Φ3, and Φ4. In addition, the Bitstream is passed through circuit 65, which performs a low pass filtering and decimation to yield the output digital code (in which the ratio of 1s to 0s over a given window of time represents the desired output μ, which can be used to calculate the temperature of the chip into which the temperature sensor circuit 5 is integrated).

Figure 3C:
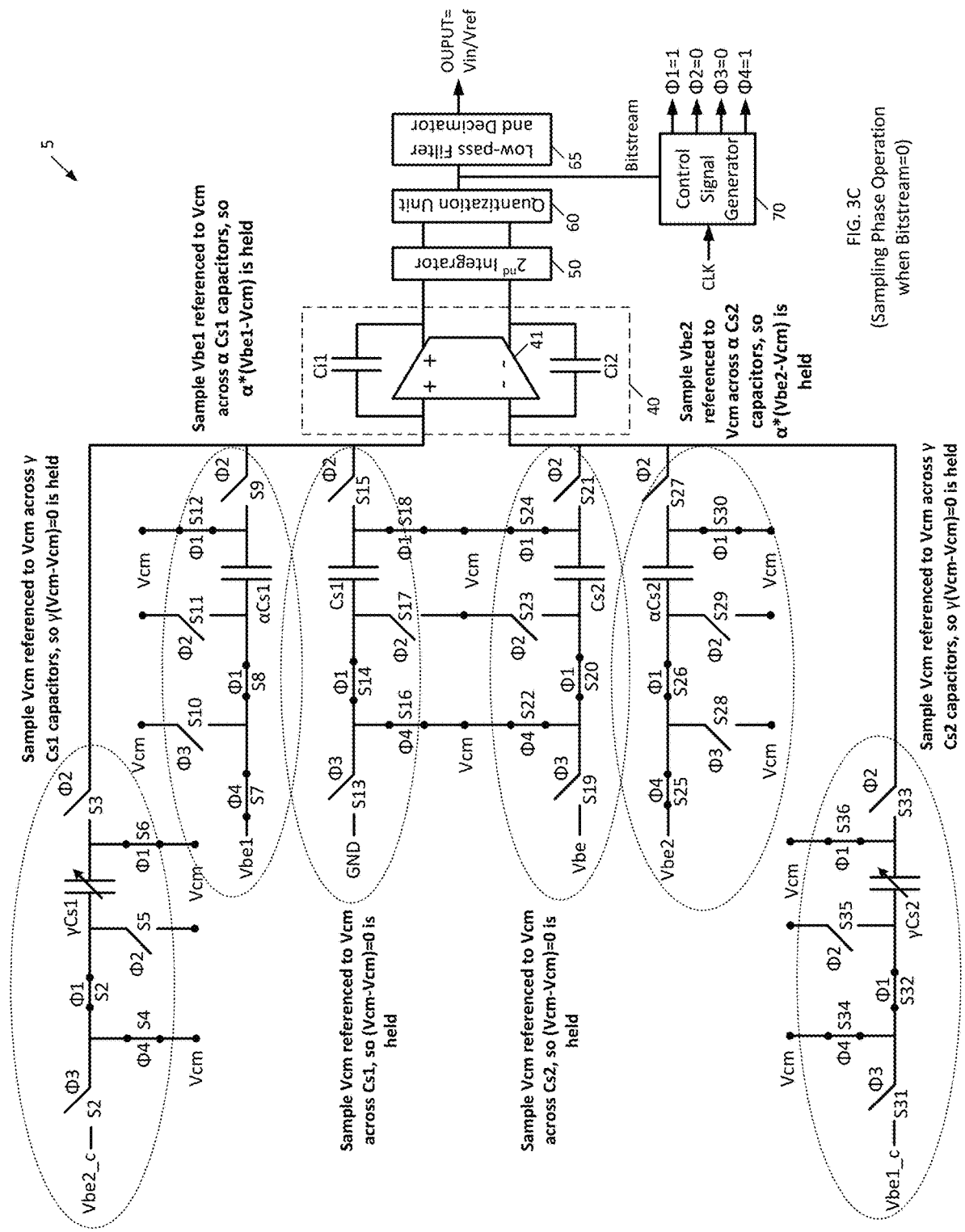
FIG. 3C shows the design of FIG. 2 operating in a sampling phase when the previously output bit of the generated bitstream was a logic 0.

Assume now that the next bit produced by the quantization circuit 60 is a logical 0. In such a case, as shown in FIG. 4, when the clock signal CLK transitions to logic high and the Bitstream is at a logic zero, the control signal generator 70 causes the control signals Φ1 and Φ4 to transition to logic high and stay logic high until the clock signal CLK transitions to a logic low, while maintaining the control signals Φ2 and Φ3 logic low, thereby beginning a sampling phase. This sampling phase is shown in FIG. 3C, where it can be seen that: switches S7, S8, and S12 close to sample the voltage Vbe1 referenced to the common mode voltage Vcm across the adjustable capacitance αCs1, thereby charging the adjustable capacitance αCs1 to the voltage α*(Vbe1−Vcm); and switches S25, S26, and S30 close to sample the voltage Vbe2 referenced to the common mode voltage Vcm across the adjustable capacitance αCs2, thereby charging the adjustable capacitance αCs2 to the voltage α*(Vbe2−Vcm).

In addition, so as to maintain the capacitive loading on the first integrator 40 as uniform across sampling and integration phases: switches S4, S2, and S6 close to sample the common mode voltage Vcm referenced to itself across the adjustable capacitance γCs1, thereby maintaining the adjustable capacitance γCs1 at 0V; switches S16, S14, and S18 close to sample the common mode voltage Vcm referenced to itself across the capacitor Cs1, thereby maintaining the capacitor Cs1 at 0V; switches S22, S20, and S24 close to sample the common mode voltage Vcm referenced to itself across the capacitor Cs2, thereby maintaining the capacitor Cs2 at 0V; and switches S34, S32, and S36 close to sample the common mode voltage referenced to itself across the adjustable capacitance γCs2, thereby maintaining the adjustable capacitance γCs2 at 0V.

When the clock signal CLK then transitions to a logic low, as shown in FIG. 4, the control signal generator 70 then causes the control signals Φ1 and 14 to transition to a logic low, causes the control signal Φ2 to transition to logic high, and maintains the control signal Φ3 logic low, thereby beginning an integration phase. This integration phase is shown in FIG. 3D, where it can be seen that: switches S11 and S9 close to add the voltage αVcm to the α*(Vbe1−Vcm) stored across the adjustable capacitance αCs1, thereby applying the voltage αVbe1 to the non-inverting terminal of the integrator 40; and switches S29 and S27 close to add the voltage αVcm to the voltage α*(Vbe2−Vcm) stored across the adjustable capacitance αCs2, thereby applying the voltage αVbe2 to the inverting terminal of the integrator 40.

In addition, so as to maintain the capacitive loading on the first integrator 40 as uniform across sampling and integration phases: switches S5 and S3 close to add γVcm to the 0V stored across the adjustable capacitance γCs1, thereby applying the voltage γVcm to the non-inverting terminal of the integrator 40; switches S17 and S15 close to add Vcm to the 0V stored across the capacitor Cs1, thereby applying the voltage Vcm to the non-inverting terminal of the integrator 40; switches S23 and S21 close to add Vcm to the 0V stored across the capacitor Cs2, thereby applying the voltage Vcm to the inverting terminal of the integrator 40; and switches S35 and S33 close to add γVcm to the 0V stored across the adjustable capacitance γCs2, thereby applying the voltage γVcm to the inverting terminal of the integrator 40.

Summing the voltages applied to the non-inverting terminal of the integrator 40 yields the voltage αVbe1+γVcm+Vcm, while summing the voltages applied to the inverting terminal of the integrator 40 yields the voltage αVbe2+γVcm+Vcm. The result of the integration performed by the integrator 40 is therefore the voltage αVbe1−αVbe2, assuming the integrator 40 has a unity gain.

As stated above, when the Bitstream is 0, it is desired to sample the voltage αΔVbe=αVbe1−αVbe2, which as shown immediately above, is the result of the integration performed by the integrator 40 in FIG. 3D.

Therefore, it can be seen that when the Bitstream is 0, the integrator 40 integrates the voltage αΔVbe, as desired. The second integrator 50 performs a further integration of the voltage αΔVbe, which is then quantized to generate a next bit of the Bitstream by the quantization circuit 60. This next bit of the Bitstream will be used by the control signal generator 70 to generate new values of the control signals Φ1, Φ2, Φ3, and Φ4. In addition, the Bitstream is passed through the low-pass filtering and decimation circuit 65, which performs a low pass filtering and decimation to yield the output digital code (in which the ratio of 1s to 0s over a given window of time represents the desired output μ, which can be used to calculate the temperature of the chip into which the temperature sensor circuit 5 is integrated).

Through the use of the adjustable capacitances γCs1 and γCs2, the compensation voltage γVnl can be adjusted so that it has the same non-linear component as the voltage Vbe, thereby permitting proper correction of the non-linear component of the voltage Vbe. Note that this implementation lacks the use of operational amplifiers to generate the compensation voltage γVnl or other circuitries that introduce their own non-linearities. In addition, through the use of the adjustable capacitances αCs1 and αCs2, the voltage ΔVbe can be properly scaled, also without the use of operational amplifiers to generate the voltage α ΔVbe.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A temperature sensing circuit, comprising:
a voltage generation circuitry comprising:
first and second bipolar junction transistors having coupled collectors and bases, and biased at different current densities;
a third bipolar junction transistor having its collector coupled to its base, the third bipolar junction transistor biased by a calibrated current and having a base-emitter voltage that is a voltage complementary to absolute temperature, the voltage complementary to absolute temperature having a curved non-linearity across temperature; and
fourth and fifth bipolar junction transistors having coupled collectors and bases, the fifth bipolar junction transistor biased by a temperature independent constant current, the fourth bipolar junction transistor biased by a current proportional to absolute temperature;
a switched capacitor circuit configured to selectively sample voltages produced by the voltage generation circuitry and provide the sampled voltages to inputs of an integrator;
a quantization circuit configured to quantize outputs of the integrator to produce a bitstream;
wherein the switched capacitor circuit cooperates with the integrator under control of the bitstream to:
when a most recent bit of the bitstream is a logic zero, cause integration of a difference between a base-emitter voltage of the first bipolar junction transistor and a base-emitter voltage of the second bipolar junction transistor to thereby produce a voltage proportional to absolute temperature; and when the most recent bit of the bitstream is a logic one, cause integration of a difference between a base-emitter voltage of the fourth bipolar junction transistor and a sum of the voltage complementary to absolute temperature and a base-emitter voltage of the fifth bipolar junction transistor to thereby produce a negative voltage complementary to absolute temperature having negligible non-linearity across temperature; and a low pass filter and decimator configured to filter and decimate the bitstream produced by the quantization circuit to produce a voltage indicative of a temperature of a chip into which the temperature sensing circuit is placed.

2. The temperature sensing circuit of claim 1, wherein the switched capacitor circuit comprises:

a first variable capacitance used to sample and hold the base-emitter voltage of the fourth bipolar junction transistor, the first variable capacitance being comprised of a number γ of parallel connected capacitors of a same capacitance; and a second variable capacitance used to sample and hold the base-emitter voltage of the fifth bipolar junction transistor, the second variable capacitance being comprised of γ parallel connected capacitors of a same capacitance;

wherein γ is selected such that the curved non-linearity across temperature in the voltage complementary to absolute temperature is canceled out during integration of the difference between the base-emitter voltage of the fourth bipolar junction transistor and a sum of the voltage complementary to absolute temperature and the base-emitter voltage of the fifth bipolar junction transistor.

3. The temperature sensing circuit of claim 2, wherein the switched capacitor circuit further comprises:

a third variable capacitance used to sample and hold the base-emitter voltage of the first bipolar junction transistor, the third variable capacitance being comprised of a number α of parallel connected capacitors of a same capacitance;

a first fixed capacitance used to sample and hold ground;

a second fixed capacitance used to sample and hold the base-emitter voltage of the third bipolar junction transistor; and a fourth variable capacitance used to sample and hold the base-emitter voltage of the second bipolar junction transistor, the fourth variable capacitance being comprised of α parallel connected capacitors of a same capacitance.

4. The temperature sensing circuit of claim 3, wherein the switched capacitor circuit further comprises:

a first switch having a first node coupled to the base-emitter voltage of the fourth bipolar junction transistor, wherein the first switch operates in response to a third control signal;

a second switch having a first node coupled to a second node of the first switch and a second node coupled to a first node of the first variable capacitance, wherein the second switch operates in response to a first control signal;

a third switch having a first node coupled to a second node of the first variable capacitance and a second node coupled to a non-inverting input of the integrator, wherein the third switch operates in response to a second control signal;

a fourth switch having a first node coupled to the second node of the first switch and a second node coupled to a common mode voltage, wherein the fourth switch operates in response to a fourth control signal;

a fifth switch having a first node coupled to the first node of the first variable capacitance and a second node coupled to the common mode voltage, wherein the fifth switch operates in response to the second control signal; and a sixth switch having a first node coupled to the second node of the first variable capacitance and a second node coupled to the common mode voltage, wherein the sixth switch operates in response to the first control signal.

5. The temperature sensing circuit of claim 4, wherein the switched capacitor circuit further comprises:

a seventh switch having a first node coupled to the base-emitter voltage of the first bipolar junction transistor, wherein the seventh switch operates in response to the fourth control signal;

an eighth switch having a first node coupled to a second node of the seventh switch and a second node coupled to a first node of the third variable capacitance, wherein the eighth switch operates in response to the first control signal;

a ninth switch having a first node coupled to a second node of the third variable capacitance and a second node coupled to the non-inverting input of the integrator, wherein the ninth switch operates in response to the second control signal;

a tenth switch having a first node coupled to the second node of the seventh switch and a second node coupled to the common mode voltage, wherein the tenth switch operates in response to the third control signal;

an eleventh having a first node coupled to the first node of the third variable capacitance and a second node coupled to the common mode voltage, wherein the eleventh switch operates in response to the second control signal; and a twelfth having a first node coupled to the second node of the third variable capacitance and a second node coupled to the common mode voltage, wherein the twelfth switch operates in response to the first control signal.

6. The temperature sensing circuit of claim 5, wherein the switched capacitor circuit further comprises:

a thirteenth switch having a first node coupled to ground, wherein the thirteenth switch operates in response to the third control signal;

a fourteenth switch having a first node coupled to a second node of the thirteenth switch and a second node coupled to a first node of the first fixed capacitance, wherein the fourteenth switch operates in response to the first control signal;

a fifteenth switch having a first node coupled to a second node of the first fixed capacitance and a second node coupled to the non-inverting input of the integrator, wherein the fifteenth switch operates in response to the second control signal;

a sixteenth switch having a first node coupled to the second node of the thirteenth switch and a second node coupled to the common mode voltage, wherein the sixteenth switch operates in response to the fourth control signal;

a seventeenth switch having a first node coupled to the first node of the first fixed capacitance and a second node coupled to the common mode voltage, wherein the seventeenth switch operates in response to the second control signal; and an eighteenth switch having a first node coupled to the second node of the first fixed capacitance and a second node coupled to the common mode voltage, wherein the eighteenth switch operates in response to the first control signal.

7. The temperature sensing circuit of claim 6, wherein the switched capacitor circuit further comprises:

a nineteenth switch having a first node coupled to the base-emitter voltage of the third bipolar junction transistor, wherein the nineteenth switch operates in response to the third control signal;

a twentieth switch having a first node coupled to a second node of the nineteenth switch and a second node coupled to a first node of the second fixed capacitance, wherein the twentieth switch operates in response to the first control signal;

a twenty first switch having a first node coupled to a second node of the second fixed capacitance and a second node coupled to an inverting input of the integrator, wherein the twenty first switch operates in response to the second control signal;

a twenty second switch having a first node coupled to the second node of the nineteenth switch and a second node coupled to the common mode voltage, wherein the twenty second switch operates in response to the fourth control signal;

a twenty third switch having a first node coupled to the first node of the second fixed capacitance and a second node coupled to the common mode voltage, wherein the twenty third switch operates in response to the second control signal; and a twenty fourth switch having a first node coupled to the second node of the second fixed capacitance and a second node coupled to the common mode voltage, wherein the twenty fourth switch operates in response to the first control signal.

8. The temperature sensing circuit of claim 7, wherein the switched capacitor circuit further comprises:

a twenty fifth switch having a first node coupled to the base-emitter voltage of the second bipolar junction transistor, wherein the twenty fifth switch operates in response to the fourth control signal;

a twenty sixth switch having a first node coupled to a second node of the twenty fifth switch and a second node coupled to a first node of the fourth variable capacitance, wherein the twenty sixth switch operates in response to the first control signal;

a twenty seventh switch having a first node coupled to a second node of the fourth variable capacitance and a second node coupled to the inverting input of the integrator, wherein the twenty seventh switch operates in response to the second control signal;

a twenty eighth switch having a first node coupled to the second node of the twenty fifth switch and a second node coupled to the common mode voltage, wherein the twenty eighth switch operates in response to the third control signal;

a twenty ninth switch having a first node coupled to the first node of the fourth variable capacitance and a second node coupled to the common mode voltage, wherein the twenty ninth switch operates in response to the second control signal; and a thirtieth switch having a first node coupled to the second node of the fourth variable capacitance and a second node coupled to the common mode voltage, wherein the thirtieth switch operates in response to the first control signal.

9. The temperature sensing circuit of claim 8, wherein the switched capacitor circuit further comprises:

a thirty first switch having a first node coupled to the base-emitter voltage of the fifth bipolar junction transistor, wherein the thirty first switch operates in response to the third control signal;

a thirty second switch having a first node coupled to a second node of the thirty first switch and a second node coupled to a first node of the second variable capacitance, wherein the thirty second switch operates in response to the first control signal;

a thirty third switch having a first node coupled to a second node of the second variable capacitance and a second node coupled to the non-inverting input of the integrator, wherein the thirty third switch operates in response to the second control signal;

a thirty fourth switch having a first node coupled to the second node of the thirty first switch and a second node coupled to the common mode voltage, wherein the thirty fourth switch operates in response to the fourth control signal;

a thirty fifth switch having a first node coupled to the first node of the second variable capacitance and a second node coupled to the common mode voltage, wherein the thirty fifth switch operates in response to the second control signal; and a thirty sixth switch having a first node coupled to the second node of the second variable capacitance and a second node coupled to the common mode voltage, wherein the thirty sixth switch operates in response to the first control signal.

10. The temperature sensing circuit of claim 9, further comprising a control signal generator configured to, when the most recent bit of the bitstream is a logic zero:

in a sampling phase, assert the first control signal and fourth control signal, while deasserting the second and third control signals; and in an integration phase, assert the second control signals while deasserting the first, third, and fourth control signals.

11. The temperature sensing circuit of claim 10, wherein the control signal generator is further configured to, when the most recent bit of the bitstream is a logic one:

in a sampling phase, assert the first control signal and third control signal, while the second and fourth control signals; and in an integration phase, assert the second control signal, while deasserting the first, third, and fourth control signals.

12. A temperature sensing circuit, comprising:

a voltage generation circuitry comprising:

first and second bipolar junction transistors having coupled collectors and bases, and biased at different current densities;

a third bipolar junction transistor having its collector coupled to its base, the third bipolar junction transistor biased by a calibrated current and having a base-emitter voltage that is a voltage complementary to absolute temperature, the voltage complementary to absolute temperature having a curved non-linearity across temperature; and fourth and fifth bipolar junction transistors having coupled collectors and bases, the fifth bipolar junction transistor biased by a temperature independent constant current, the fourth bipolar junction transistor biased by a current proportional to absolute temperature;

a switched capacitor circuit configured to selectively sample voltages produced by the voltage generation circuitry and provide the sampled voltages to inputs of an integrator; and a quantization circuit configured to quantize outputs of the integrator to produce a bitstream;

wherein the switched capacitor circuit cooperates with the integrator under control of the bitstream to cause integration of a difference between a base-emitter voltage of the first bipolar junction transistor and a base-emitter voltage of the second bipolar junction transistor to thereby produce a voltage proportional to absolute temperature, or cause integration of a difference between a base-emitter voltage of the fourth bipolar junction transistor and a sum of the voltage complementary to absolute temperature and a base-emitter voltage of the fifth bipolar junction transistor to thereby produce a negative voltage complementary to absolute temperature having negligible non-linearity across temperature.

13. The temperature sensing circuit of claim 12, wherein the switched capacitor circuit comprises:
   a first variable capacitance used to sample and hold the base-emitter voltage of the fourth bipolar junction transistor, the first variable capacitance being comprised of a number $\gamma$ of parallel connected capacitors of a same capacitance;
   a second variable capacitance used to sample and hold the base-emitter voltage of the fifth bipolar junction transistor, the second variable capacitance being comprised of $\gamma$ parallel connected capacitors of a same capacitance;
   wherein $\gamma$ is selected such that the curved non-linearity across temperature in the voltage complementary to absolute temperature is canceled out during integration of the difference between the base-emitter voltage of the fourth bipolar junction transistor and a sum of the voltage complementary to absolute temperature and the base-emitter voltage of the fifth bipolar junction transistor;
   a third variable capacitance used to sample and hold the base-emitter voltage of the first bipolar junction transistor, the third variable capacitance being comprised of a number $\alpha$ of parallel connected capacitors of a same capacitance;
   a first fixed capacitance used to sample and hold ground;
   a second fixed capacitance used to sample and hold the base-emitter voltage of the third bipolar junction transistor; and
   a fourth variable capacitance used to sample and hold the base-emitter voltage of the second bipolar junction transistor, the fourth variable capacitance being comprised of $\alpha$ parallel connected capacitors of a same capacitance.

14. A temperature sensing circuit, comprising:
   a voltage generation circuitry comprising:
      first and second bipolar junction transistors having coupled collectors and bases, and biased at different current densities;
      a third bipolar junction transistor having its collector coupled to its base, the third bipolar junction transistor biased by a calibrated current and having a base-emitter voltage that is a voltage complementary to absolute temperature, the voltage complementary to absolute temperature having a curved non-linearity across temperature; and
      fourth and fifth bipolar junction transistors having coupled collectors and bases, the fifth bipolar junction transistor biased by a temperature independent constant current, the fourth bipolar junction transistor biased by a current proportional to absolute temperature;
   a switched capacitor circuit configured to selectively sample voltages produced by the voltage generation circuitry and provide the sampled voltages to inputs of an integrator;
   a quantization circuit configured to quantize outputs of the integrator to produce a bitstream;
   wherein the switched capacitor circuit cooperates with the integrator under control of the bitstream; and
   a low pass filter and decimator configured to filter and decimate the bitstream produced by the quantization circuit to produce a voltage indicative of a temperature of a chip into which the temperature sensing circuit is placed.

15. The temperature sensing circuit of claim 14, wherein the switched capacitor circuit comprises:
   a first variable capacitance used to sample and hold the base-emitter voltage of the fourth bipolar junction transistor, the first variable capacitance being comprised of a number $\gamma$ of parallel connected capacitors of a same capacitance; and
   a second variable capacitance used to sample and hold the base-emitter voltage of the fifth bipolar junction transistor, the second variable capacitance being comprised of $\gamma$ parallel connected capacitors of a same capacitance;
   wherein $\gamma$ is selected such that the curved non-linearity across temperature in the voltage complementary to absolute temperature is canceled out during integration of the difference between the base-emitter voltage of the fourth bipolar junction transistor and a sum of the voltage complementary to absolute temperature and the base-emitter voltage of the fifth bipolar junction transistor.

16. The temperature sensing circuit of claim 15, wherein the switched capacitor circuit further comprises:
   a third variable capacitance used to sample and hold the base-emitter voltage of the first bipolar junction transistor, the third variable capacitance being comprised of a number $\alpha$ of parallel connected capacitors of a same capacitance;
   a first fixed capacitance used to sample and hold ground;
   a second fixed capacitance used to sample and hold the base-emitter voltage of the third bipolar junction transistor; and
   a fourth variable capacitance used to sample and hold the base-emitter voltage of the second bipolar junction transistor, the fourth variable capacitance being comprised of $\alpha$ parallel connected capacitors of a same capacitance.

17. The temperature sensing circuit of claim 16, wherein the switched capacitor circuit further comprises:
   a first switch having a first node coupled to the base-emitter voltage of the fourth bipolar junction transistor, wherein the first switch operates in response to a third control signal;

a second switch having a first node coupled to a second node of the first switch and a second node coupled to a first node of the first variable capacitance, wherein the second switch operates in response to a first control signal;

a third switch having a first node coupled to a second node of the first variable capacitance and a second node coupled to a non-inverting input of the integrator, wherein the third switch operates in response to a second control signal;

a fourth switch having a first node coupled to the second node of the first switch and a second node coupled to a common mode voltage, wherein the fourth switch operates in response to a fourth control signal;

a fifth switch having a first node coupled to the first node of the first variable capacitance and a second node coupled to the common mode voltage, wherein the fifth switch operates in response to the second control signal; and a sixth switch having a first node coupled to the second node of the first variable capacitance and a second node coupled to the common mode voltage, wherein the sixth switch operates in response to the first control signal.

18. The temperature sensing circuit of claim 17, wherein the switched capacitor circuit further comprises:

a seventh switch having a first node coupled to the base-emitter voltage of the first bipolar junction transistor, wherein the seventh switch operates in response to the fourth control signal;

an eighth switch having a first node coupled to a second node of the seventh switch and a second node coupled to a first node of the third variable capacitance, wherein the eighth switch operates in response to the first control signal;

a ninth switch having a first node coupled to a second node of the third variable capacitance and a second node coupled to the non-inverting input of the integrator, wherein the ninth switch operates in response to the second control signal;

a tenth switch having a first node coupled to the second node of the seventh switch and a second node coupled to the common mode voltage, wherein the tenth switch operates in response to the third control signal;

an eleventh having a first node coupled to the first node of the third variable capacitance and a second node coupled to the common mode voltage, wherein the eleventh switch operates in response to the second control signal; and a twelfth having a first node coupled to the second node of the third variable capacitance and a second node coupled to the common mode voltage, wherein the twelfth switch operates in response to the first control signal.

19. The temperature sensing circuit of claim 18, wherein the switched capacitor circuit further comprises:

a thirteenth switch having a first node coupled to ground, wherein the thirteenth switch operates in response to the third control signal;

a fourteenth switch having a first node coupled to a second node of the thirteenth switch and a second node coupled to a first node of the first fixed capacitance, wherein the fourteenth switch operates in response to the first control signal;

a fifteenth switch having a first node coupled to a second node of the first fixed capacitance and a second node coupled to the non-inverting input of the integrator, wherein the fifteenth switch operates in response to the second control signal;

a sixteenth switch having a first node coupled to the second node of the thirteenth switch and a second node coupled to the common mode voltage, wherein the sixteenth switch operates in response to the fourth control signal;

a seventeenth switch having a first node coupled to the first node of the first fixed capacitance and a second node coupled to the common mode voltage, wherein the seventeenth switch operates in response to the second control signal; and an eighteenth switch having a first node coupled to the second node of the first fixed capacitance and a second node coupled to the common mode voltage, wherein the eighteenth switch operates in response to the first control signal.

20. The temperature sensing circuit of claim 19, wherein the switched capacitor circuit further comprises:

a nineteenth switch having a first node coupled to the base-emitter voltage of the third bipolar junction transistor, wherein the nineteenth switch operates in response to the third control signal;

a twentieth switch having a first node coupled to a second node of the nineteenth switch and a second node coupled to a first node of the second fixed capacitance, wherein the twentieth switch operates in response to the first control signal;

a twenty first switch having a first node coupled to a second node of the second fixed capacitance and a second node coupled to an inverting input of the integrator, wherein the twenty first switch operates in response to the second control signal;

a twenty second switch having a first node coupled to the second node of the nineteenth switch and a second node coupled to the common mode voltage, wherein the twenty second switch operates in response to the fourth control signal;

a twenty third switch having a first node coupled to the first node of the second fixed capacitance and a second node coupled to the common mode voltage, wherein the twenty third switch operates in response to the second control signal; and a twenty fourth switch having a first node coupled to the second node of the second fixed capacitance and a second node coupled to the common mode voltage, wherein the twenty fourth switch operates in response to the first control signal.

21. The temperature sensing circuit of claim 20, wherein the switched capacitor circuit further comprises:

a twenty fifth switch having a first node coupled to the base-emitter voltage of the second bipolar junction transistor, wherein the twenty fifth switch operates in response to the fourth control signal;

a twenty sixth switch having a first node coupled to a second node of the twenty fifth switch and a second node coupled to a first node of the fourth variable capacitance, wherein the twenty sixth switch operates in response to the first control signal;

a twenty seventh switch having a first node coupled to a second node of the fourth variable capacitance and a second node coupled to the inverting input of the integrator, wherein the twenty seventh switch operates in response to the second control signal;

a twenty eighth switch having a first node coupled to the second node of the twenty fifth switch and a second node coupled to the common mode voltage, wherein the twenty eighth switch operates in response to the third control signal;

a twenty ninth switch having a first node coupled to the first node of the fourth variable capacitance and a second node coupled to the common mode voltage, wherein the twenty ninth switch operates in response to the second control signal; and a thirtieth switch having a first node coupled to the second node of the fourth variable capacitance and a second node coupled to the common mode voltage, wherein the thirtieth switch operates in response to the first control signal.

22. The temperature sensing circuit of claim 21, wherein the switched capacitor circuit further comprises:

a thirty first switch having a first node coupled to the base-emitter voltage of the fifth bipolar junction transistor, wherein the thirty first switch operates in response to the third control signal;

a thirty second switch having a first node coupled to a second node of the thirty first switch and a second node coupled to a first node of the second variable capacitance, wherein the thirty second switch operates in response to the first control signal;

a thirty third switch having a first node coupled to a second node of the second variable capacitance and a second node coupled to the non-inverting input of the integrator, wherein the thirty third switch operates in response to the second control signal;

a thirty fourth switch having a first node coupled to the second node of the thirty first switch and a second node coupled to the common mode voltage, wherein the thirty fourth switch operates in response to the fourth control signal;

a thirty fifth switch having a first node coupled to the first node of the second variable capacitance and a second node coupled to the common mode voltage, wherein the thirty fifth switch operates in response to the second control signal; and a thirty sixth switch having a first node coupled to the second node of the second variable capacitance and a second node coupled to the common mode voltage, wherein the thirty sixth switch operates in response to the first control signal.

\* \* \* \* \*